United States Patent
Mahajan

(10) Patent No.: US 6,327,696 B1
(45) Date of Patent: Dec. 4, 2001

(54) METHOD AND APPARATUS FOR ZERO SKEW ROUTING FROM A FIXED H TRUNK

(75) Inventor: Sanjeev Mahajan, San Francisco, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/072,570

(22) Filed: May 5, 1998

(51) Int. Cl.[7] .................................................... G06F 17/50
(52) U.S. Cl. ................................................ 716/12; 716/5
(58) Field of Search ............................... 716/12, 13, 14, 716/5

(56) References Cited

U.S. PATENT DOCUMENTS 5,917,729 * 6/1999 Naganuma et al. .................... 716/12
6,006,025 * 12/1999 Cook et al. ............................ 713/503

OTHER PUBLICATIONS

Tsay, R.–S., "An Exact Zero–Skew Clock Routing Algorithm", IEEE Transactions on Computer–Aided Design of Integrated Circuits and Systems, vol. 12, No. 2, pp. 242–249, Feb. 1993.*

Ting–Hai Chao, Yu–Chin Hsu, Jan–Ming Ho, Boese, K.D., and Kahng, A. B., "Zero Skew Clock Routing with Minimum Wirelength", IEEE Transactions on Circuits and Systems—II: Analog and Digital Signal Processing, vol. 39, No. 11, pp. 799–814, Nov. 1992.*

Cong, J. Kahng, A.B., Cheng–Kok Koh, and Tsao, C.–W.A., "Bounded–Skew Clock and Steiner Routing Under Elmore Delay", Proceedings of the 1995 IEEE/ACM International Conference on Computer–Aided Design, 1995, pp. 66–71, Nov. 1995.*

Zhu, Q. Dai, and W.W.M., "High–Speed Clock Network Sizing Optimization Based on Distributed RC and Lossy RLC Interconnect Models", IEEE Transactions on Computer–Aided Design of Integrated Circuits and Systems, vol. 15, No. 9, pp. 1106–1118, Sep. 1996.*

* cited by examiner

Primary Examiner—Matthew Smith
Assistant Examiner—Vuthe Siek
(74) Attorney, Agent, or Firm—Mitchell, Silberberg & Knupp LLP

(57) ABSTRACT

Provided is a technique for reducing skew in routing a clock signal in an integrated circuit device by prerouting an H trunk, dividing the H trunk into parts, and balancing delays in one of the parts by adding snaking wire. In a more particular aspect, the clock signal is prerouted as an H trunk, and the H trunk is divided into a left-top quadrant, a left-bottom quadrant, a right-top quadrant, and a right-bottom quadrant. The signal delays are balanced as between the two left quadrants by adding snaking wire, the signal delays are balanced between the two right quadrants by adding snaking wire, and the signal delays are balanced between the right half and the left half by adding snaking wire.

11 Claims, 5 Drawing Sheets

Figure 2 — Elmore Delay from a to c = $R_1(C_1+C_2+C_3)+R_3C_3$
Elmore Delay from a to b = $R_1(C_1+C_2+C_3)$
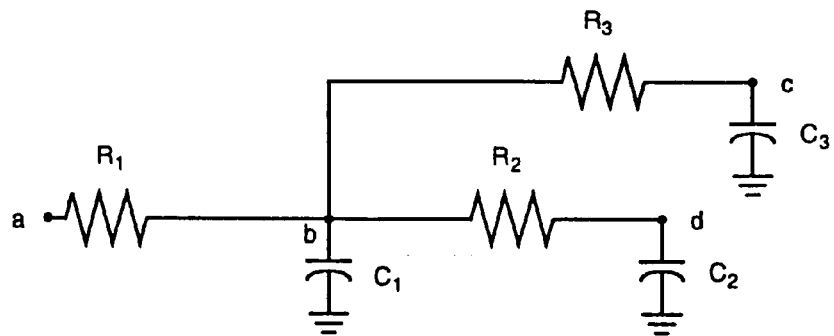
Figure 3
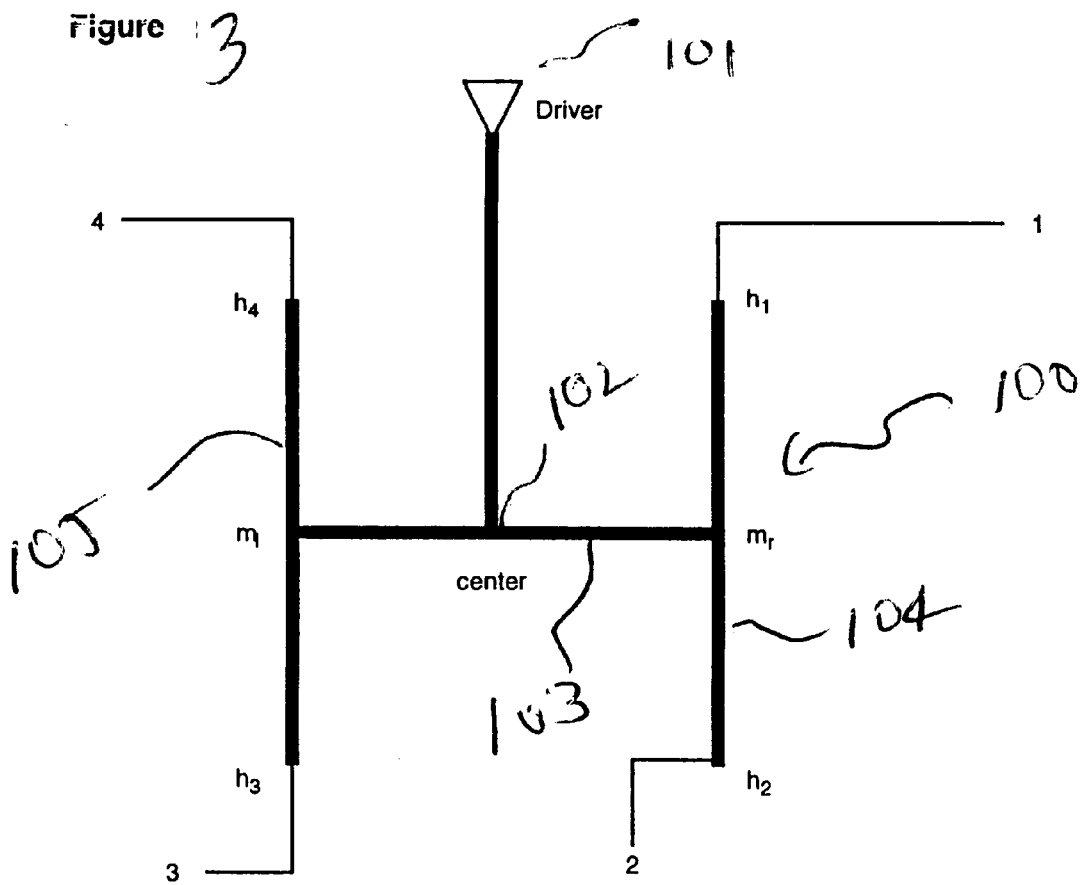

METHOD AND APPARATUS FOR ZERO SKEW ROUTING FROM A FIXED H TRUNK

BACKGROUND OF THE INVENTION

A. Field of Invention

This invention relates to the field of semiconductor design and fabrication. Specifically, this invention relates to the achievement of zero skew while routing a clock net.

B. Description of the Related Art

"Routing" in semiconductor fabrication involves determining wiring paths between elements on the surface of an integrated circuit. As is described more fully below, clocks require special attention during the routing process. It is desirable to have a clock signal reach all the functional elements to which the clock is connected at the same time. This allows a higher clock frequency thereby increasing the performance of the integrated circuit. As is described more fully herein, the present invention involves clock routing and related techniques for increasing chip performance.

1. Integrated Circuit Basics

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected, thus connecting the logic circuits having the pins. Because a typical chip has thousands, tens of thousands, or hundreds of thousands of pins, that must be connected in various combinations, the chip also includes definitions of thousands, tens of thousands, or hundreds of thousands of nets, or sets of pins.

The number of the nets for a chip is typically in the same order as the order of the number of cells on that chip. Commonly, a majority of the nets include only two pins to be connected; however, many nets comprise three or more pins. Some nets may include hundreds of pins or thousands or tens of thousands to be connected. A netlist is a list of nets including names of connected pins or a list of cells including names of nets that connect to pins of cells. Clock nets typically have around 100,000 flipflops.

2. Chip Fabrication

As mentioned above, the present invention involves the clock routing. Routing is one of the steps necessary for the fabrication of an IC. These additional steps are very well known by those skilled in the art of semiconductor fabrication and are briefly described below.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

An exemplary integrated circuit chip is illustrated in FIG. 1 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

The input to the physical design problem is a circuit diagram, and the output is the layout of the circuit. This is accomplished in several stages including partitioning, floor planning, placement, routing and compaction.

Partitioning. A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement. This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

Routing. The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Compaction. Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

Wafer Construction. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

3. Zero Skew Routing of Clock Nets

Clock nets in very large scale integration systems need special attention with respect to routing. The performance of an IC is proportional to clock frequency. Clock nets need to be routed with precision since the actual length of the path of a net from its entry point to its terminals determines the maximum clock frequency on which a chip may operate. Accordingly, it is preferable that the clock signal arrive simultaneously at all functional units.

In reality, clock signals do not arrive at all functional units simultaneously. The maximum difference in the arrival time of a clock at two different components is called "skew." Thus, the goal in routing clock nets is to achieve as close to "zero skew" as is possible.

Accordingly, the chip designer is faced with the following problem: Given a clock driver and a number of flip-flops distributed arbitrarily on a chip, find a route from the clock driver to each of the flip-flops such that when a clock signal is sent from the driver, the delay to each of the flip-flops (because of the parasitic capacitances of the wires) is about the same, or alternatively, skew which is defined to be the difference between the largest delay and the smallest delay is close to zero.

The classical zero skew routing of Tsay builds a zero skew bottom-up tree, by choosing two pins under which the skew is zero, merging them by routing, and then finding a balance point (which will be the new tapping point) from which delays to all the bottom level flip-flops below this balance point are the same. A copy of Tsay's article "Exact Zero Skew," published in 1991 is attached hereto as Appendix 1 and incorporated herein by this reference as though set forth in full. In this case, such a balance point does not exist (because the delay to the flip-flops below one of the pins is much larger than that of the other), it adds enough wire in the route so that the delays are now equal if the tapping point is placed at the pin with the larger delay to all its bottom level flip-flops. Tsay uses the Elmore Delay model because of its mathematical elegance and ease of use. This delay model approximates the real delay well for clock trees. A copy of Elmore's article "The Transient Response of Damped Linear Networks with Particular Regard to Wideband Amplifiers," is attached as Appendix 2 and incorporated herein by this reference as though set forth in full.

Although Tsay's approach can be theoretically carried all the way up to the clock driver, certain practical considerations obviate its implementation. Electrical considerations imply that the driver will be driving much current, and hence the wire coming out of the driver needs to be very thick to handle such heavy currents. So if one is trying to do a zero skew route all the way to the top, one runs out of routing resources quickly because routing extremely thick wires at the top level becomes problematic due to the interference of wires already routed.

For this reason, some space (a preroute) is normally reserved which is used for routing at the top level to the driver. For symmetry, this preroute is generally an H trunk, whose middle wire and legs are much thicker than the wires that are used for lower level zero skew routing, and the driver then connects to the center of the middle wire.

This is shown in FIG. 3. Shown in FIG. 3 is an H trunk 100 comprising a left segment 105, a middle segment 103 and a right segment 104. The driver 101 is connected to the center 102 of the middle segment. The H trunk is connected to various flip-flops (1, 2, 3 and 4).

In the presence of an H trunk, the zero skew routing then proceeds in the following manner. First, the die is divided into four quadrants, top-left, top-right, bottom-left, and bottom-right. The pins in each quadrant are independently routed using Tsay's algorithm until there is one tapping point in each of the four quadrants. These four tapping points are then connected to the four apexes of the H. The pairing of tapping points to apexes can be done so as to minimize total wirelength used. But now a natural question presents itself. Although the delay from each tapping point to its respective bottom level flip-flops is the same, the inter-quadrant delays are not. So how does one ensure that one gets zero skew? A natural solution is to add enough wire on the smaller delay sides so that the delays are equalized. However, because of the details of the Elmore Delay, the computation of the exact amount of wire to be added in different quadrants is a non-trivial problem. The purpose of the present invention is to allow computation of the wirelengths that need to be added to achieve zero skew. In particular, this involves an efficient solution of two simultaneous quadratic equations in two variables. After computation of the wirelengths that need to be added to achieve zero skew, the routing process is completed with the additional wirelengths added and the steps described above with respect to semiconductor fabrication are executed and the IC is manufactured.

SUMMARY OF THE INVENTION

Accordingly, the present invention provides for a method for reducing skew in routing a clock signal in an integrated circuit device, said method comprising the steps of prerouting an H trunk, dividing the H trunk into parts, and balancing delays in one of the parts by adding snaking wire. More specifically, the method comprises prerouting the clock signal as an H trunk, dividing the H trunk into a left-top quadrant, a left-bottom quadrant, a right-top quadrant, and a right-bottom quadrant, balancing the signal delays between the two left quadrants by adding snaking wire, balancing the signal delays between the two right quadrants by adding snaking wire, and balancing the signal delays between the right half and the left half by adding snaking wire.

The present invention also provides for an apparatus for constructing a connected covering for a net. The apparatus includes at least one processor and memory connected to the processor. The memory may be any machine-readable storage medium containing the instructions for the processor to perform the steps of the present invention.

These and other aspects, features, and advantages of the present invention will be apparent to those persons having ordinary skill in the art to which the present invention relates from the foregoing description and the accompanying drawings.

BRIEF DESCRIPTION OF THE DRAWINGS

FIG. 2 illustrates Elmore delay.

FIG. 3 is a schematic of an H trunk.

DESCRIPTION OF THE PREFERRED EMBODIMENTS

Figure 1:
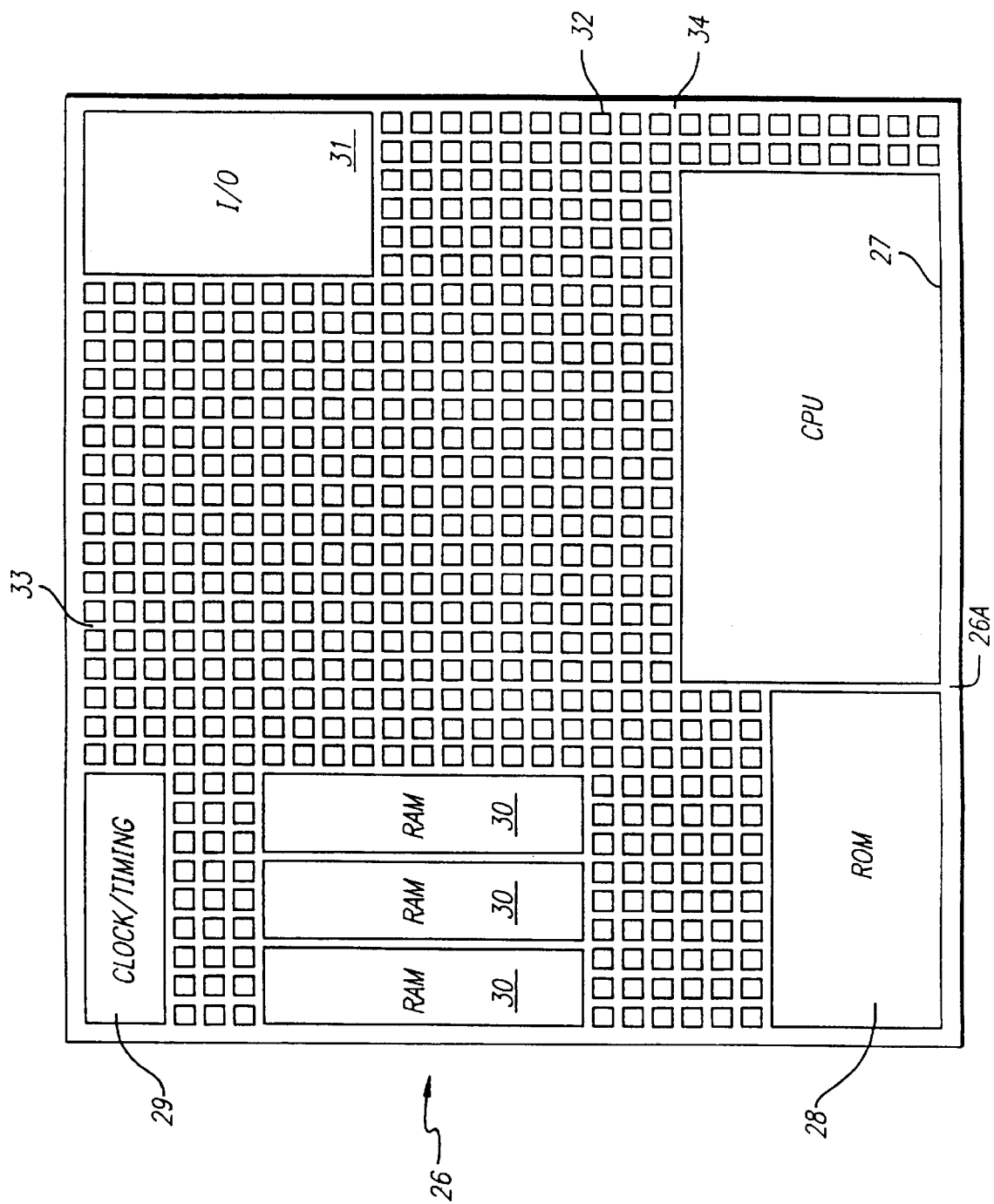
FIG. 1 is a depiction of an integrated circuit.

As a first step in the present invention, following Tsay, the Elmore model is used to compute delays. This model approximates well the real delay for clock trees. The Elmore delay at a particular node in a circuit is defined as the first moment of the impulse response at that node. For an RC tree, the Elmore delay between two nodes of the tree turns out to be the sum of products of resistances (between the two nodes) and the sum of all downstream capacitances following that resistance.

This is shown in FIG. 2. In FIG. 2, the following relationships hold:

Elmore Delay from $a$ to $c = R_1(C_1+C_2+C_3)+R_3C_3$

Elmore Delay from $a$ to $b = R_1(C_2+C_1+C_3)$

We represent a wire with resistance R and parasitic capacitance C by a π model where a capacitance of C/2 each is put on the two sides of the resistance R. We follow a hybrid approach to solve the zero skew problem. At the lower levels, we use Tsay's zero skew algorithm; and at the top level, we use the H trunk approach. The primary contribution of the present invention is a correct and efficient implementation for achieving zero skew in the presence of an H trunk.

Without loss of generality, we use the following simplifying assumptions. Removing these assumptions does not change the algorithms fundamentally; it only makes the calculations more tedious. First, we assume that the H trunk is completely symmetric; that is, all four half legs are of equal length. We also assume that the driver connects directly to the center of the H. Finally, we assume that resistive and capacitive characteristics of horizontal and vertical wires (which are used in ordinary zero skew routing, in contrast to the wires forming the H trunk) are the same.

That is, we have the same resistance per unit length and capacitance per unit length for both vertical and horizontal wires.

Let us assume that the four tapping points in the four respective quadrants, as shown in FIG. 3, are 1, 2, 3, and 4 (top-right, bottom-right, bottom-left and top-left) and the apexes of H which get respectively paired to them be $h_1$, $h_2$, $h_3$ and $h_4$ (so as to minimize total wirelength). We use the following notation.

$l_i$=length of the route from i to $h_i$ (for i=1, 2, 3, 4)
$R_l$=resistance of each half-leg
$C_l$=parasitic capacitance of each half-leg
$R_m$=resistance of each half of the middle trunk
$C_m$=parasitic capacitance of each half of the middle trunk
p=resistance per unit length of the wire routing any H-apex $h_i$ to i
cap=parasitic capacitance per unit length of the wire routing any H-apex $h_i$ to i
$\delta_i$=delay from the tapping point i to any of its bottom level flip-flops
$C_i$=downstream capacitance from the tapping point i to any of its bottom level flip-flops
$m_l$=left apex of the middle trunk
$m_r$=right apex of the middle trunk
center=midpoint of the middle trunk, to which the driver is connected To balance delays, we use the following strategy. We first balance delays for the bottom-left and top-left quadrants, then between top-right and bottom-right quadrants; and then between the left and the right sides. This ordering ensures that, for instance, when we balance delays from $m_l$ to the flips-flops on the top-left quadrant and $m_l$ and flips-flops on bottom-left quadrant (by adding snaking wire), the skew from center to the right quadrants will not be affected (because Elmore delay only depends on resistances and their downstream capacitances). To balance delays on the left side (and similarly for the right side), we first compute the Elmore delay from $m_l$ to both quadrants on the left. Let $delay_t$ and $delay_b$ be the delays from $m_l$ to the flip-flops on the top-left and bottom-left quadrant respectively. Then $$delay_t = \delta_4 + R_1\left(\frac{C_1}{2} + cl_4 + C_4\right) + pl_4\left(\frac{cl_4}{2} + C_4\right)$$

$$delay_b = \delta_3 + R_1\left(\frac{C_1}{2} + cl_3 + C_3\right) + pl_3\left(\frac{cl_3}{2} + C_3\right)$$

Figure 4:
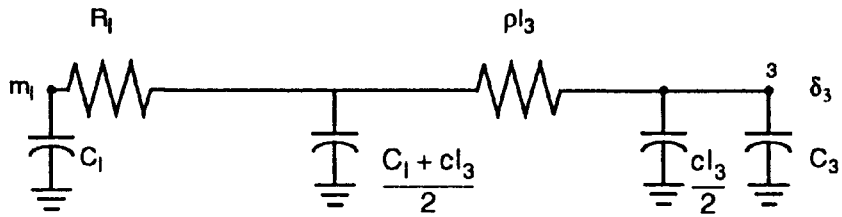
FIG. 4 illustrates the delay in top and bottom quadrants.

This is reflected in FIG. 4. If $delay_t > delay_b$, then a snaking wire needs to be inserted on the bottom route to equalize delays. The converse holds if $delay_b$ happens to be larger. Let the length of the wire that needs to be inserted at the bottom be x. To equalize delays, we must satisfy $$\delta_3 + R_1\left(\frac{C_1}{2} + c(l_3 + x) + C_3\right) + p(l_3 + x)\left(\frac{c(l_3 + x)}{2} + C_3\right) = delay_t$$

Simplifying, we get $$pcl_3 x^2/2 + (plc_3 + R_1 c)x + delay_b - delay_t = 0$$

The only non-negative solution to this quadratic equation is $$x = \frac{\sqrt{(pcl_3 + R_1 c)^2 + 2(delay_t - delay_b)} - (pcl_3 + R_1 c)}{pcl_3}$$

Similar computations hold for the right quadrants.

After balancing delays on the quadrants on the left and the right sides, assume that the delay and the downstream capacitance from $m_l$ to the left flip-flops is $delay_l$ and $cap_l$ respectively, and delay and downstream capacitance from $m_r$ to the right flip-flops is $delay_r$ and $cap_r$ respectively. To simplify notation, let us also denote the lengths of the routes in the four quadrants after snaking to be $l_1$, $l_2$, $l_3$ and $l_4$, respectively. Now the delay from center to the left flip-flops ($delay_1$) is $$delay_1 = R_m\left(\frac{C_m}{2} + cap_l\right) + delay_l$$

Figure 5:
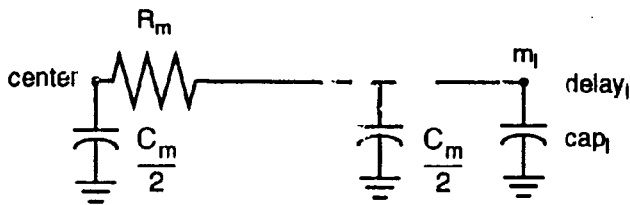
FIG. 5 illustrates the delay from the center of the H trunk to the left flip-flops.

This is reflected in FIG. 5. Similarly the delay from center to the right flip-flops ($delay_2$) is $$delay_2 = R_m\left(\frac{C_m}{2} + cap_r\right) + delay_r$$

Now, if $delay_1 > delay_2$, we need to insert snaking wire in both quadrants on the right side to balance delays. The converse holds if $delay_2$ is bigger. However, we cannot simply balance delays by first inserting a snaking wire for the top-right route and then bottom-right route (or vice-versa) in a sequential manner. The reason is that the Elmore delay from center to the top-right flip-flops is affected when a wire is being inserted on the bottom-right route and vice-versa. So we need to do simultaneous snaking at this point; that is, we need to insert enough (and no more) wire on the top-right and the bottom-right route so that all the four delays from center are equal. Let us assume that we simultaneously add snaking lengths x and on top-right and bottom-right routes. x and y will be determined by equalizing delays. Delay from center to the top-right flip-flops is $$R_m\left(\frac{C_m}{2} + 2C_l + c(l_1 + x) + c(l_1 + y) + C_1 + C_2\right) +$$
$$R_l\left(\frac{C_l}{2} + c(l_2 + x) + C_1\right) + p(l_1 + x)(c(l_1 + x) + C_1) + \delta_1$$

Figure 6:
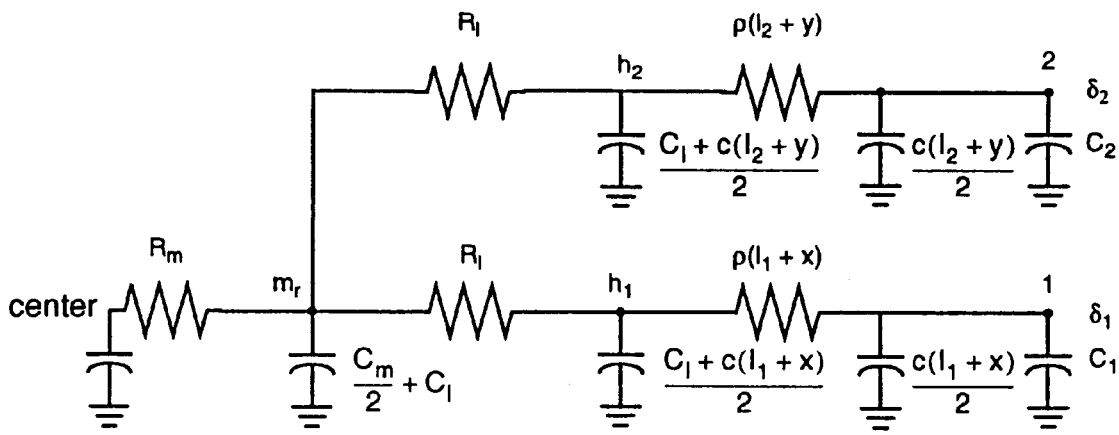
FIG. 6 illustrates the delay from the center of the H trunk to the right flip-flops.

This is shown in FIG. 6. Similarly the delay from center to the bottom-right flip-flops is $$R_m\left(\frac{C_m}{2} + 2C_l + c(l_2 + y) + c(l_2 + x) + C_1 + C_2\right) +$$
$$R_l\left(\frac{C_l}{2} + c(l_1 + y) + C_1\right) + p(l_2 + y)(c(l_1 + y) + C_2) + \delta_2$$

Equating both of these expressions to $delay_1$, we get simultaneous quadratic equations of the following form:

$$Ax^2 + B_1 x + Cy = D$$
$$Ax^2 + B_2 x + Cy = D$$

where all the coefficients are positive and $B_1 \geq C$ and $B_2 \geq C$. When H is asymmetric or the electrical characteristics of horizontal and vertical wires are different, we get quadratic equations of the following form:

$$A_1 x^2 + B_1 x + C_1 y = D$$

where all the coefficients are positive and $B_1 \geq C_2$ and $B_2 \geq C_1$.

$$A_2 x^2 + B_2 x + C_2 y = D$$

We can show that these equations admit non-negative solutions.

As such, the theorem is that the following system of quadratic equations $$A_1 x^2 + B_1 x + C_1 y = D \quad (1)$$

$$A_2 x^2 + B_2 x + C_2 y = D \quad (2)$$

where all the coefficients are positive and $B_1 \geq C_2$ and $B_2 \geq C_1$, admits of a unique solution $x' \geq 0$ and $y' \geq 0$.

This is so because the parabola corresponding to equation 1 intersects the y axis at $y_1 = D/C_1$, and x axis at $x_1 =$ $$\frac{\sqrt{B_1^2 + 4A_1 D} - B_1}{2A_1}$$

Similarly the parabola corresponding to equation 2 intersects the x axis at $x_2 = D/C_2$ and y axis at $y_2 =$ $$\frac{\sqrt{B_2^2 + 4A_2 D} - B_2}{2A_2}$$

Figure 7:
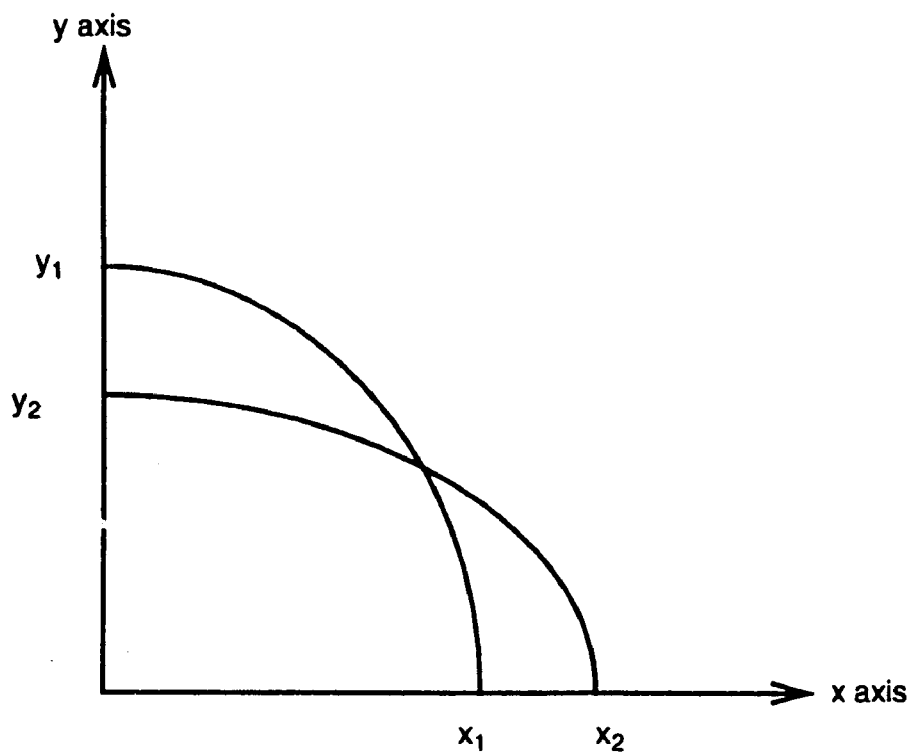
FIG. 7 illustrates the intersection of two parabola.

Using the conditions on the coefficients, one can prove that $x_1 \geq x_2$ and $y_2 \geq y_1$. It is then clear that the two parabola intersect uniquely in the first quadrant. See FIG. 7. We can use any of the well known methods, such as the Newton's method or the secant method, to solve this system of equations to within an arbitrarily small error, efficiently.

If x' and y' are non-negative solutions to the simultaneous equations given above, then we need to insert wires of length x' to the route between 1 and $h_1$ and length y' between 2 and $h_2$ to equalize the delays in all four quadrants. As discussed above, these wire lengths are so inserted and the IC fabrication process is completed as described above.

4. Design System Environment

Generally, the methods described herein with respect to IC design, analysis and routing will be practiced with a general purpose computer, either with a single processor or multiple processors. Generally, RTL code will be supplied. The design steps thereafter including use of the algorithms discussed herein, employed will then be performed by a general purpose computer.

Figure 8:
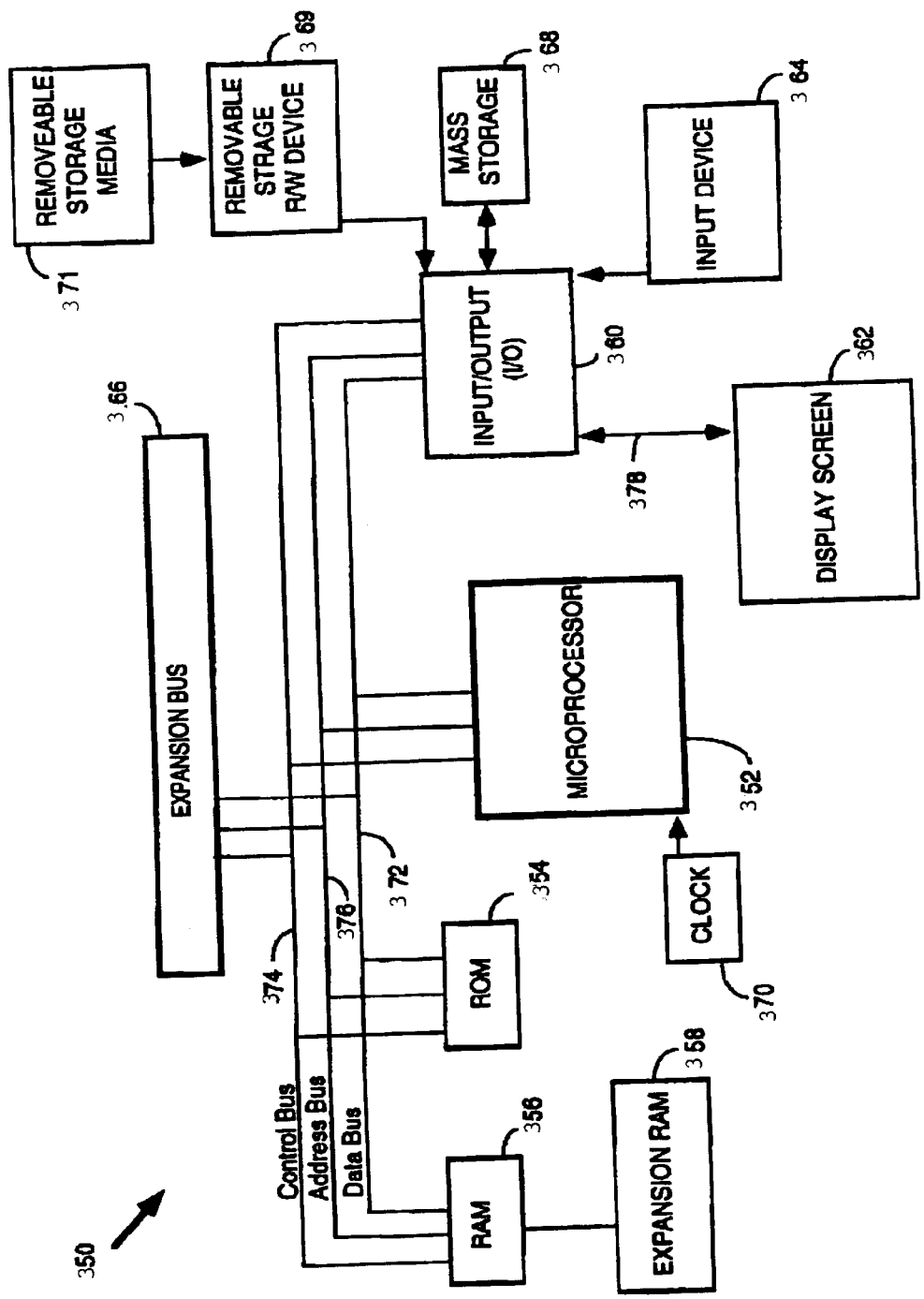
FIG. 8 depicts the design system environment.

FIG. 8 is an illustration of a general purpose computer system, representing one of many suitable computer platforms for implementing the inventive zero skew methods described above. FIG. 8 shows a general purpose computer system 350 in accordance with the present invention that includes a central processing unit (CPU) 352, read only memory (ROM) 354, random access memory (RAM) 356, expansion RAM 358, input/output (I/O) circuitry 360, display assembly 362, input device 364, and expansion bus 366. Computer system 350 may also optionally include a mass storage unit 368 such as a disk drive unit or nonvolatile memory such as flash memory and a real-time clock 370.

CPU 352 is coupled to ROM 354 by a data bus 372, control bus 374, and address bus 376. ROM 354 contains the basic operating system for the computer system 350. CPU 352 is also connected to RAM 356 by busses 372, 374, and 376. Expansion RAM 358 is optionally coupled to RAM 356 for use by CPU 352. CPU 352 is also coupled to the I/O circuitry 360 by data bus 372, control bus 374, and address bus 376 to permit data transfers with peripheral devices.

I/O circuitry 360 typically includes a number of latches, registers and direct memory access (DMA) controllers. The purpose of I/O circuitry 360 is to provide an interface between CPU 352 and such peripheral devices as display assembly 362, input device 364, and mass storage 368.

Display assembly 362 of computer system 350 is an output device coupled to I/O circuitry 360 by a data bus 378. Display assembly 362 receives data from I/O circuitry 360 via bus 378 and displays that data on a suitable screen.

The screen for display assembly 362 can be a device that uses a cathode-ray tube (CRT), liquid crystal display (LCD), or the like, of the types commercially available from a variety of manufacturers. Input device 364 can be a keyboard, a mouse, a stylus working in cooperation with a position-sensing display, or the like. The aforementioned input devices are available from a variety of vendors and are well known in the art.

Some type of mass storage 368 is generally considered desirable. However, mass storage 368 can be eliminated by providing a sufficient mount of RAM 356 and expansion RAM 358 to store user application programs and data. In that case, RAMs 356 and 358 can optionally be provided with a backup battery to prevent the loss of data even when computer system 350 is turned off. However, it is generally desirable to have some type of long term mass storage 368 such as a commercially available hard disk drive, nonvolatile memory such as flash memory, battery backed RAM, PC-data cards, or the like.

A removable storage read/write device 369 may be coupled to I/O circuitry 360 to read from and to write to a removable storage media 371. Removable storage media 371 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 350 by typing on a keyboard, manipulating a mouse or trackball, or "writing" on a tablet or on position-sensing screen of display assembly 362. CPU 352 then processes the data under control of an operating system and an application program stored in ROM 354 and/or RAM 356. CPU 352 then typically produces data which is outputted to the display assembly 362 to produce appropriate images on its screen.

Expansion bus 366 is coupled to data bus 372, control bus 374, and address bus 376. Expansion bus 366 provides extra ports to couple devices such as network interface circuits, modems, display switches, microphones, speakers, etc. to CPU 352. Network communication is accomplished through the network interface circuit and an appropriate network.

Suitable computers for use in implementing the present invention may be obtained from various vendors. Various computers, however, may be used depending upon the size and complexity of the tasks. Suitable computers include mainframe computers, multiprocessor computers, workstations, or personal computers.

It should be understood that the present invention also relates to machine readable media on which are stored program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

What is claimed is:

1. A method for reducing skew in routing a clock signal in an integrated circuit device, said method comprising the following steps:

a. prerouting an H trunk;

b. dividing the H trunk into a left-top quadrant, a left-bottom quadrant, a right-top quadrant, and a right-bottom quadrant;

c. balancing the signals as between the two left quadrants by adding snaking wire;

d. balancing the signals as between the two right quadrants by adding snaking wire; and e. balancing the signals as between the right half and the left half by adding snaking wire, wherein, in performing step d, snaking wire is added to both the right-top and right-bottom substantially simultaneously.

2. An apparatus for reducing skew in routing a clock signal in an integrated circuit device, said apparatus comprising:

a. means for prerouting an H trunk;

b. means for dividing the H trunk into a left-top quadrant, a left-bottom quadrant, a right-top quadrant, and a right-bottom quadrant;

c. means for balancing the signals as between the two left quadrants by adding snaking wire;

d. means for balancing the signals as between the two right quadrants by adding snaking wire; and e. means for balancing the signals as between the right half and the left half by adding snaking wire, wherein, element d comprises means for adding to both the right-top and right-bottom substantially simultaneously.

3. A method for reducing skew in routing a clock signal in an integrated circuit device, said method comprising:

a. prerouting an H trunk comprising two halves: a left half that includes a top-left tapping point and a bottom-left tapping point and a right half that includes a top-right tapping point and a bottom-right tapping point;

b. balancing delays as between the top-left tapping point and the bottom-left tapping point by adding any necessary snaking wire;

c. balancing delays as between the top-right tapping point and the bottom-right tapping point by adding any necessary snaking wire; and d. upon completion of steps b and c, balancing delays as between the left half and the right half by adding any necessary snaking wire, wherein step d comprises adding snaking wire to both tapping points of one of the halves, and wherein lengths of snaking wire to add to said both tapping points are determined simultaneously.

4. A method according to claim 3, wherein said lengths are calculated by simultaneously solving two quadratic equations.

5. A method according to claim 3, wherein an amount of snaking added in step is calculated by solving a quadratic equation.

6. An apparatus for reducing skew in routing a clock signal in an integrated circuit device, said apparatus comprising:

a. means for prerouting an H trunk comprising two halves: a left half that includes a top-left tapping point and a bottom-left tapping point and a right half that includes a top-right tapping point and a bottom-right tapping point;

b. means for balancing delays as between the top-left tapping point and the bottom-left tapping point by adding any necessary snaking wire;

c. means for balancing delays as between the top-right tapping point and the bottom-right tapping point by adding any necessary snaking wire; and d. means for upon completion of steps b and c, balancing delays as between the left half and the right half by adding any necessary snaking wire, wherein said means d comprises means for adding snaking wire to both tapping points of one of the halves, and wherein lengths of snaking wire to add to said both tapping points are determined simultaneously.

7. An apparatus according to claim 6, wherein said lengths are calculated by simultaneously solving two quadratic equations.

8. An apparatus according to claim 6, wherein an amount of snaking added by means b is calculated by solving a quadratic equation.

9. A computer-readable medium storing computer-executable process steps for reducing skew in routing a clock signal in an integrated circuit device, said process steps comprising steps to:

a. preroute an H trunk comprising two halves: a left half that includes a top-left tapping point and a bottom-left tapping point and a right half that includes a top-right tapping point and a bottom-right tapping point;

b. balance delays as between the top-left tapping point and the bottom-left tapping point by adding any necessary snaking wire;

c. balance delays as between the top-right tapping point and the bottom-right tapping point by adding any necessary snaking wire; and d. upon completion of steps b and c, balance delays as between the left half and the right half by adding any necessary snaking wire, wherein step d comprises adding snaking wire to both tapping points of one of the halves, and wherein lengths of snaking wire to add to said both tapping points are determined simultaneously.

10. A computer-readable medium according to claim 9, wherein said lengths are calculated by simultaneously solving two quadratic equations.

11. A computer-readable medium according to claim 9, wherein an amount of snaking added in step b is calculated by solving a quadratic equation.

* * * * *